(12) United States Patent
Yamashina et al.

(10) Patent No.: US 7,618,475 B2
(45) Date of Patent: Nov. 17, 2009

(54) METAL POWDER FOR ELECTRICALLY CONDUCTIVE PASTE AND ELECTRICALLY CONDUCTIVE PASTE

(75) Inventors: Hiroyuki Yamashina, Okayama (JP); Hidefumi Fujita, Okayama (JP); Tatsuya Ibaraki, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 147 days.

(21) Appl. No.: 11/340,652

(22) Filed: Jan. 27, 2006

(65) Prior Publication Data

US 2006/0179975 A1    Aug. 17, 2006

(30) Foreign Application Priority Data

Jan. 31, 2005    (JP) .............................. 2005-022502

(51) Int. Cl.
*B22F 1/00*    (2006.01)
(52) U.S. Cl. ......................................... 75/255; 252/512
(58) Field of Classification Search ................... 75/255, 75/252; 252/512, 513, 514
See application file for complete search history.

(56) References Cited

U.S. PATENT DOCUMENTS

| 4,318,747 | A | * | 3/1982 | Ishijima et al. ............. 106/403 |
| 4,663,189 | A | * | 5/1987 | Borland ........................ 427/79 |
| 4,884,754 | A | * | 12/1989 | Kemp et al. ..................... 241/5 |
| 4,976,777 | A | * | 12/1990 | Ozawa et al. .................. 75/255 |
| 5,389,122 | A | * | 2/1995 | Glicksman .................... 75/370 |
| 5,492,653 | A | * | 2/1996 | Hochheimer et al. ........ 252/514 |
| 2003/0015062 | A1 | * | 1/2003 | Sano et al. ..................... 75/247 |
| 2003/0178604 | A1 | * | 9/2003 | Okada et al. ................. 252/500 |
| 2005/0183543 | A1 | * | 8/2005 | Sasaki et al. ................... 75/371 |
| 2006/0137488 | A1 | * | 6/2006 | Sakaue et al. ................. 75/255 |
| 2007/0209475 | A1 | * | 9/2007 | Sakaue et al. ................. 75/255 |

FOREIGN PATENT DOCUMENTS

| JP | 7-118701 | 5/1995 |
| JP | 11-264001 | 9/1999 |
| JP | 2003-119501 | 4/2003 |
| JP | 2004-27246 | 1/2004 |

\* cited by examiner

*Primary Examiner*—Roy King
*Assistant Examiner*—Ngoclan T Mai
(74) *Attorney, Agent, or Firm*—Clark & Brody

(57) ABSTRACT

A metal powder for a conductive paste has an average particle diameter D50 not greater than 5 μm and an X value defined by equation (1) not greater than 0.5:

$$X\text{ value} = D50\ (\mu m)/\text{BET specific surface area }(m^2/g) \quad (1)$$

The metal powder for a conductive paste is particularly preferable when wart-like projections of a diameter not greater than 150 nm are present on the particle surfaces. Typical types of the metal powder include Cu, Ag, Au, Pd, Pt, Ni, Al and alloys thereof. The metal powder for a conductive paste enables fabrication of a conductor having a low void ratio after the paste is fired.

7 Claims, 3 Drawing Sheets

Example 1 (Jet mill crushing)

Comparative Example 2 (Bead mill crushing)

Comparative Example 1 (Ball mill crushing)

Example 1 (Before crushing)   (After crushing)

Example 2 (Before crushing)   (After crushing)

Comparative Example 1 (Before crushing)   (After crushing)

Comparative Example 2 (Before crushing)     (After crushing)

Example 1 (Jet mill crushing)     Comparative Example 2 (Bead mill crushing)

METAL POWDER FOR ELECTRICALLY CONDUCTIVE PASTE AND ELECTRICALLY CONDUCTIVE PASTE

BACKGROUND OF THE INVENTION

1. Field of the Invention:

This invention relates to a metal powder used as an electrically conductive filler for an electrically conductive paste and an electrically conductive paste using the metal powder.

2. Background Art:

Powders of silver, copper and other metals have conventionally been used as electrically conductive fillers for electrically conductive pastes. When a conductive paste prepared using a conductive filler is formed into a conductor, the filler is necessary to ensure good retentivity and accuracy of the conductor shape without increasing the conductor resistance. For this, it is generally considered preferable for the particles of the metal powder to be flaky rather than spherical. Flaky metal powder has a large specific surface area owing to the flatness of its particles, so that when the metal powder is used in a conductive paste the contact area between the particles becomes large. This is advantageous from the viewpoint of minimizing electrical resistance and regulating paste rheology.

A conventional method used to produce a flaky metal powder for a conductive filler is to plastically deform the particles of a metal powder obtained by electrolytic deposition, wet reduction, atomization or other such method into a flat shape by crushing the metal powder in a ball mill, bead mill or other such crusher. Related technologies are set out in JP 7-118701A, JP 11-264001A, JP2003-119501A and JP2004-27246A.

The trend in electronic equipment continues to be toward lighter weight and smaller size. This has further increased the need to make the electrodes of electronic components thinner and electronic wiring finer. However, currently available metal powder production methods are limited in the degree to which they can reduce the size of the fine particle flakes. Various problems are encountered when using a ball mill, bead mill or the like for flattening. For example, the setting of the crushing aid conditions and the like is troublesome and the use of balls, beads or other such crushing media makes necessary a process for separating the crushing medium and material powder. Moreover, flattening by the wet method involves additional dry processes such as a drying step, which increases cost. Moreover, when a metal powder flattened using a ball mill, bead mill or the like is utilized, many voids are liable to occur in the conductor obtained by firing the paste.

An object of this invention is therefore to provide a novel metal powder that is obtainable by a production process whose process load is smaller than that by a conventional mechanical crushing means and that when used as a conductive paste filler provides a fired conductor low in voids.

SUMMARY OF THE INVENTION

The inventors learned through various studies that when a metal powder of a specific structure flaked using a dry opposed jet mill is used as an electrically conductive filler, the void ratio of the fired electrical conductor is markedly low. This invention provides a metal powder for an electrically conductive paste, e.g., a Cu powder, whose average particle diameter D50 is not greater than 5 μm and whose X value defined by equation (1) below is not greater than 0.5. This invention further provides an electrically conductive paste using the metal powder.

$$X \text{ value} = D50 \ (\mu m)/\text{BET specific surface area } (m^2/g) \quad (1)$$

D50 is the average particle diameter measured by a laser diffraction particle size analyzer. BET specific surface area is the specific surface area calculated by the Brunauer-Emmitt-Teller method.

A metal powder of the foregoing description whose particle surfaces are covered with wart-like projections of a diameter not greater than 150 nm at a coverage ratio of, for example, not less than 30% is an excellent choice. The coverage ratio in this case means the proportion of the overall surface area seen in planar view accounted for by the area of the portions where the wart-like projections are present. The area of the portions where the wart-like projections are present can be taken as the projected area of the wart-like projection portions when the wart-like projections are viewed in a direction perpendicular to the surface surrounding the wart-like projections.

The metal powder of this invention markedly reduces voids present in the conductor after firing in comparison with a conventional metal powder for a conductive paste. As a result, the density of the fired conductor increases to enhance conductivity and contribute to finer wiring pitch. The metal powder of this invention also improves the reliability of the electronic devices in which it is used. Moreover, the metal powder of this invention helps to reduce conductive filler cost because it can be produced by a method that has a low process load.

DESCRIPTION OF THE PREFERRED EMBODIMENT

Figure 1:
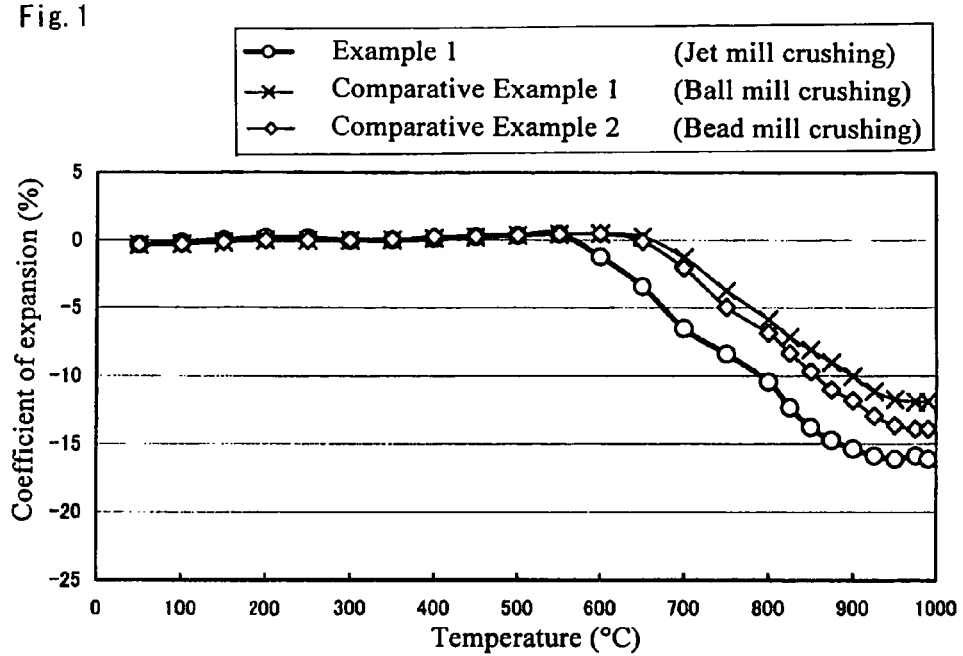
FIG. 1 is a graph showing expansion coefficients measured with a TMA (thermal mechanical analyzer) for specimen copper powders obtained in Example 1, Comparative Example 1 and Comparative Example 2.

The metal powder for a conductive paste provided by this invention is a metal powder structured so as to have an average particle diameter D50 of not greater than 5 μm and an X value defined by equation (1) not greater than 0.5:

$$X \text{ value} = D50 \ (\mu m)/\text{BET specific surface area } (m^2/g) \quad (1).$$

A metal powder whose average particle diameter D50 is greater than 5 μm cannot adequately achieve the finer pitch of conductors required by today's increasingly compact electronic components. D50 therefore needs to be not greater than 5 μm. The preferred range of D50 is 1-5 μm. The aspect ratio (particle major axis length/thickness) of the individual particles is preferably in the range of 1.1-40, more preferably 3-30, most preferably 4-20. When the proportion of particles having an aspect ratio under 3 exceeds, say, 10%, a problem emerges of it becoming difficult to ensure paste thixotropy. On the other hand, when the aspect ratio is too large, the particles bend easily and this may lead to the appearance of undesirable properties such as excessively high viscosity. The proportion of particles having an aspect ratio exceeding 30 is therefore preferably not greater than 10%. This "irregular flat shape" is advantageous in that it gives the conductive paste good fluidity and increases post-firing density.

The TAP density is preferably not less than 3.0 g/cm$^3$.

The X value is an index that can reflect the state of fine irregularities on the particle surface. The specific surface area of a powder generally increases with decreasing particle diameter. For the same average particle diameter, the X value decreases with increasing specific surface area, i.e., with larger number of fine surface irregularities. A study carried out by the inventors showed that the X value strongly affects the temperature at which firing of the metal powder starts. When metal powders composed of the same type of element were compared, the firing start temperature tended to decrease with smaller X value. The reason for this is still not clear but it is thought to have something to do with the presence of the wart-like projections discussed later. When the firing start temperature decreases, firing starts earlier from a lower temperature, so that a fired conductor of high density (low void ratio) can be realized.

The X value is preferably adjusted to not greater than 0.5. When it is higher than this, the effect of lowering the firing start temperature of the metal powder and, by extension, the effect of reducing voids is inadequate.

The firing start temperature can be defined as the temperature at which contraction starts when measuring change in the expansion coefficient of the powder under a constant temperature increase rate using a TMA (thermal mechanical analyzer). In the case of a Cu powder, one having a firing start temperature of 500-600° C. is a good choice. Although the firing start temperature of a Cu powder obtained by conventional crushing using a medium is usually around 650° C., the firing start temperature of a Cu powder of the present invention whose X value has been adjusted to not greater than 0.5 is reduced about 100° C. from this temperature.

The fine metal powder adjusted to an X value of not greater than 0.5 and having an average particle diameter of not greater than 5 μm can be obtained by flaking using a dry opposed jet mill. The dry opposed jet mill effects crushing by jetting powder particles carried on high-pressure carrier gas at high speed in opposite directions from facing nozzles so that the powder particles collide to be crushed by the impact of the collision. This method does not require use of a crushing medium or a crushing aid. Adherence of extraneous matter to the particle surfaces is therefore substantially nil. In addition, the degree of the crushing can be easily controlled because the crushing by collision can be repeated as desired by circulating the powder.

Although air can be used as the carrier gas and internal atmosphere gas of the dry opposed jet mill, some kinds of metals are preferably crushed using an inert gas such as nitrogen in order to prevent oxidation. The factors that determine the particle shape and structure, such as the post-crushing average particle diameter D50, flake aspect ratio (particle major axis length/thickness) and specific surface area, can be controlled by controlling the crushing pressure (carrier gas jetting pressure), supply rate of the jetted powder and crushing time. The X value can therefore be optimized. A jetting pressure of under 10 kg/cm$^2$ is adequate.

The crushing force of a conventional stirred media mill is hard to control finely. It is therefore extremely difficult to obtain a fine metal powder whose average particle diameter is not greater than 5 μm and whose X value is regulated to not greater than 0.5.

The inventors learned that when particles are flattened by mutual collision using a dry opposed jet mill, it is possible to form many fine "wart-like" projections on the surfaces of the flaky particles. Although the underlying mechanics is not completely understood, it was found from the results of compositional analysis before and after flattening that the wart-like projections do not consist of extraneous matter but of the element constituting the metal powder itself. Studies showed that when 150-nm-diameter wart-like projections, preferably 20-150-nm-diameter wart-like projections, are present on the surfaces of the flaky particles at a coverage ratio of not less than 30%, a structure whose X value is not greater than 0.5 can be readily achieved and the effect of reducing voids in the fired conductor is pronounced. A structure in which wart-like projections of not greater than 100 nm are present at a coverage ratio of not less than 30% is more preferable and one in which such projections are present at a coverage ratio of not less than 50% is still more preferable.

The starting powder crushed in the dry opposed jet mill is preferably a powder of a metal that is soft and excellent in ductility and malleability. For example, Cu, Ag, Au, Pd, Pt, Ni, Al and alloys thereof are good choices. Powders of these metals and alloys produced by various methods can be used as the starting powder. Specifically, metal powders obtained by the dry chemical method, wet reduction method, CVD method, PVD method, atomization method, electrolytic deposition method or the like can be utilized without further processing. Among these starting material powders, those obtained by the wet reduction method and atomization method are particularly advantageous for use because, compared with a starting powder obtained by the electrolytic deposition method, which contains a relatively large amount of impurities, they enable supply of a conductive filler that is high in safety and low in constituents that place a load on the environment. Lead, mercury, cadmium, hexavalent chromium, PBB, and PBD are classified as substances of high environmental load. In the present invention it is preferable to use a starting powder whose content of each of these high environmental load substances in the metal powder for a conductive paste is not greater than 2 ppm.

The foregoing metal powder can be subjected to surface treatment prior to use. However, caution is required in this case because the surface treatment agent used may remain in the conductive paste as an impurity.

A metal powder preferable for use that can be exemplified, without implying any such limitation on the shape and properties of the starting powder, is one composed of aggregated primary particles of an average particle diameter of, for example, not greater than 5 μm, preferably not greater than 3 μm, whose TAP density is not less than 2.5 g/cm$^3$, average particle diameter D50 is not greater than 35 μm, and maximum particle diameter is not greater than 200 μm. Use of such a starting powder enables stable production, by crushing with a dry opposed jet mill, of a metal powder optimum for use as a conductive filler, namely a metal powder whose TAP density is not less than 3.0 g/cm$^3$, average particle diameter D50 is 1-5 μm, number of particles of an aspect ratio of 3-30 accounts for not less than 80% of all particles, and X value is not greater than 0.5.

The metal powder of this invention can, as required, be mixed with a spherical metal powder or the like and then kneaded with a resin by an ordinary conventional method to prepare a conductive paste capable of forming a conductor low in voids after firing. The total content of the metal powder in the paste can be defined in the approximate range of 50-85 mass percent.

EXAMPLES

Example 1

As the starting material was used 500 g of dendritic electrolytic copper powder having a TAP density of 2.8 g/cm$^3$, average particle diameter D50 of 30 μm, maximum particle diameter of 190 μm, and average primary particle diameter of about 1 μm. The copper powder was one that had been applied with fatty acid for surface treatment. This copper powder was flaked by crushing for 30 minutes in a dry opposed jet mill (TJ120, product of Turbo Kogyo Co., Ltd.) while effecting circulation under conditions of a crushing pressure (carrier gas pressure) of 8 kg/cm$^2$ and powder supply rate (total for two nozzles) of 1.0 kg/h. Air was used as the carrier gas and internal atmosphere gas of the mill. The crushed powder was subjected to simplified classification in a cyclone and then recovered with a bag filter.

The obtained flaky copper powder had a TAP density of 4.0 g/cm$^3$, average particle diameter D50 of 1.4 μm, BET specific surface area of 3.98 m$^2$/g, X value of 1.4/3.98=0.35, and aspect ratio of 6-12.

The average particle diameter D50 was measured with a laser diffraction particle size analyzer (LS230, product of Beckman Coulter, Inc.) The BET specific surface area was measured by the nitrogen gas adsorption method using a 4SU2 supplied by Yuasa Ionics Inc. The aspect ratio range was determined by taking a scanning electron micrograph of 30 or more arbitrarily selected particles, calculating the major axis/thickness ratio for the individual particles, and using the largest and smallest values obtained to specify the range. (The aspect ratio ranges in Example 2 and Comparative Examples 1 and 2 were similarly determined.)

Example 2

As the starting material was used 500 g of dendritic electrolytic copper powder having a TAP density of 2.8 g/cm$^3$, average particle diameter D50 of 33 μm, maximum particle diameter of 110 μm, and average primary particle diameter of about 3 μm. The copper powder was one that had been applied with fatty acid for surface treatment. This copper powder was flaked by crushing for 40 minutes in the same dry opposed jet mill as used in Example 1 while effecting circulation under conditions of a crushing pressure (carrier gas pressure) of 5 kg/cm$^2$ and powder supply rate (total for two nozzles) of 0.8 kg/h. Air was used as the carrier gas and internal atmosphere gas of the mill. The crushed powder was subjected to simplified classification in a cyclone and then recovered with a bag filter.

The obtained flaky copper powder had a TAP density of 3.8 g/cm$^3$, average particle diameter D50 of 1.6 μm, BET specific surface area of 3.68 m$^2$/g, X value of 1.6/3.68=0.43, and aspect ratio of 4-16.

Comparative Example 1

As the starting material was used 870 g of the same electrolytic copper powder as used in Example 1. This copper powder was flattened by crushing in air using a ball mill. The crushing was carried out under conditions of an electrolytic copper powder charge of 870 g, use of 12 kg of 2.3-mm-diameter zirconia balls as a crushing medium, addition of stearic acid as a crushing aid at 1.0 part by mass per 100 parts by mass of the electrolytic copper powder, ball mill vibration frequency of 60 Hz and amplitude of 5.3 mm, and crushing period of 1 hr. After crushing, the crushing medium and specimen powder were separated using a 50 μm mesh sieve.

The obtained flaky copper powder had a TAP density of 2.8 g/cm$^3$, average particle diameter D50 of 32 μm, BET specific surface area of 1.79 m$^2$/g, X value of 32/1.79=17.9, and aspect ratio of 60-220.

Comparative Example 2

As the starting material was used 870 g of the same electrolytic copper powder as used in Example 1. This copper powder was flattened by crushing in nitrogen gas using a bead mill. The crushing was carried out under conditions of an electrolytic copper powder charge of 870 g, use of 5 kg of 0.5-mm-diameter zirconia balls as a crushing medium, addition of stearic acid as a crushing aid at 1.0 part by mass per 100 parts by mass of the electrolytic copper powder, and crushing period of 1 hr. After crushing, the crushing medium and specimen powder were separated using a 32 μm mesh sieve.

The obtained flaky copper powder had a TAP density of 3.1 g/cm$^3$, average particle diameter D50 of 2.1 μm, BET specific surface area of 2.88 m$^2$/g, X value of 2.1/2.88=0.73, and aspect ratio of 20-60.

Firing Start Temperature

The firing start temperatures of the flaky copper powders obtained in Example 1, Comparative Example 1 and Comparative Example 2 (hereinafter sometimes called "specimen powders") were determined. Each specimen powder, 0.5 g, was mixed with 0.015 g of an acrylic resin vehicle (LR-981, product of Mitsubishi Rayon Co., Ltd.) and maintained under a load of 1,623 N for 10 sec using an autograph (product of Shimadzu Corporation) to obtain a pellet. A TMA (thermal mechanical analyzer; TM7000, product of ULVAC, Inc.) was used to measure the change in the expansion coefficient of the pellet under temperature increase at the rate of 10° C./min in a nitrogen gas atmosphere. The results are shown in FIG. 1. As can be seen from the graph in FIG. 1, the specimen powder of Example 1 (jet mill crushing) had a contraction start temperature of 580° C., that of Comparative Example 1 (ball mill crushing) had contraction start temperature of 700° C., and that of Comparative Example 2 (bead mill crushing) had contraction start temperature of 680° C. These temperatures were defined as the firing start temperatures of the respective specimen powders. Thus the jet mill crushed flaky copper powder of the present invention was found to have a markedly lower firing start temperature than the other flaky copper powders.

Void Ratio of Fired Conductor

Figure 2:
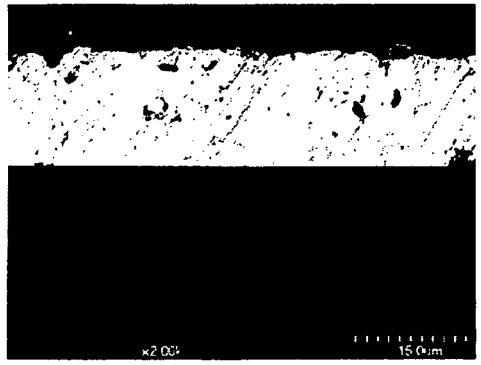
FIG. 2 is a set of scanning electron micrographs showing cross-sections of fired conductors obtained by firing conductive pastes utilizing specimen copper powders obtained in Example 1, Comparative Example 1 and Comparative Example 2.
Figure 2:
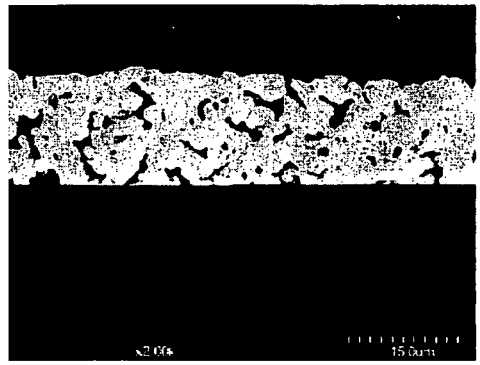
Figure 2:

Conductive pastes were prepared using the specimen copper powders obtained in Example 1, Comparative Example 1 and Comparative Example 2 as fillers. Each specimen copper powder, 33 parts by mass, was mixed with 67 parts by mass of 3-μm-diameter spherical copper powder (commercial product) to obtain a mixed copper powder. The paste was given a composition of 75 mass % of the mixed copper powder, 22 mass % of resin (LR-981, product of Mitsubishi Rayon Co., Ltd.), and 3 mass % of glass frit (ASF1891, product of Asahi Glass Co., Ltd.). The materials were kneaded and made into a paste using a three roll mill and then defoamed. The obtained paste was applied onto a ceramic chip. The chip was placed in a kiln and fired at 840° C.×30 min in a nitrogen atmosphere. The three fired chips obtained in this manner were cut and the cut surfaces were observed under a scanning electron microscope (SEM). FIG. 2 shows scanning electron micrographs of the surfaces.

The void ratios (area ratios) of the fired paste (fired conductor) cross-sections were determined from the micrographs. The void ratio of the fired conductor prepared using the specimen copper powder of Example 1 (jet mill crushing) was 6.1%, that prepared using the specimen copper powder of Comparative Example 1 (ball mill crushing) was 24.0%, that prepared using the specimen copper powder of Comparative Example 2 (bead mill crushing) was 14.7%. As is clear from FIG. 2, when the copper powder flaked by jet mill crushing in accordance with this invention was used, the fired conductor void ratio was markedly low. A key reason for this is considered to be that the firing start temperature of the jet mill crushed specimen copper powder was lower than that of the other specimen powders.

Scanning Electron Micrographs of Metal Powder Particles

Figure 7:
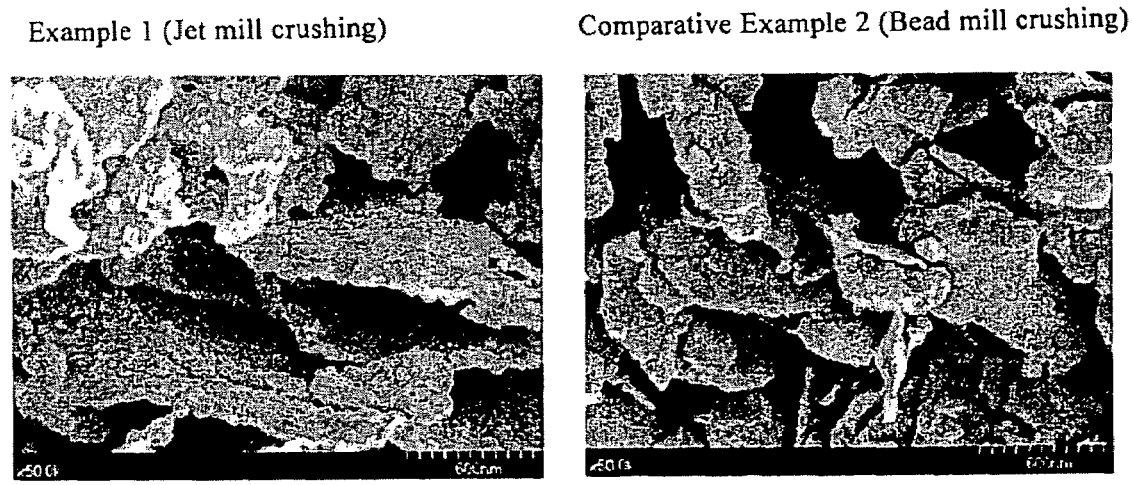
FIG. 7 is a set of scanning electron micrographs taken at high magnification showing the specimen copper powders after crushing of Example 1 and Comparative Example 2.

For reference, scanning electron micrographs of the starting material copper powders and crushed specimen copper powders of the Examples and Comparative Examples are shown in FIGS. 3 to 6. In addition, FIG. 7 shows scanning electron micrographs taken at high magnification of the specimen copper powders after crushing of Example 1 (jet mill crushing) and Comparative Example 2 (bead mill crushing). As can be seen from FIG. 7, the particle surfaces of the jet mill crushed specimen copper powder of Example 1 were covered to a coverage ratio of not less than 30% with many "wart-like projections" of a diameter not greater than 150 nm. It was found by compositional analysis that the wart-like projections consisted of Cu, not of extraneous matter.

IN THE DRAWINGS

FIG. 1
Example 1 (Jet mill crushing)
Comparative Example 1 (Ball mill crushing)
Comparative Example 2 (Bead mill crushing)
Coefficient of expansion (%)
Temperature (° C.)

FIG. 2
Example 1 (Jet mill crushing)
Comparative Example 2 (Bead mill crushing)
Comparative Example 1 (Ball mill crushing)

Figure 3:
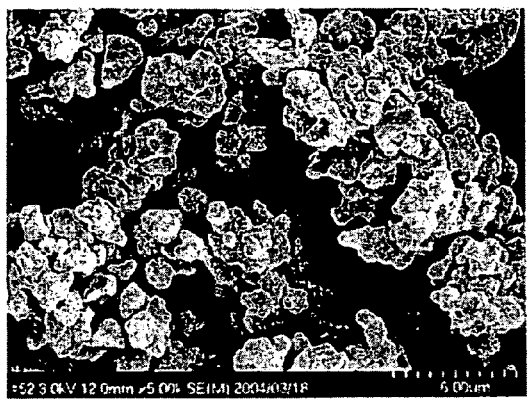
FIG. 3 is a set of scanning electron micrographs showing the starting copper powder and the specimen copper powder after crushing of Example 1.
Figure 3:
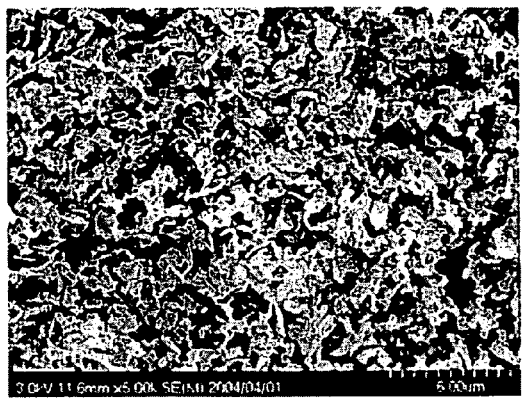
Figure 4:
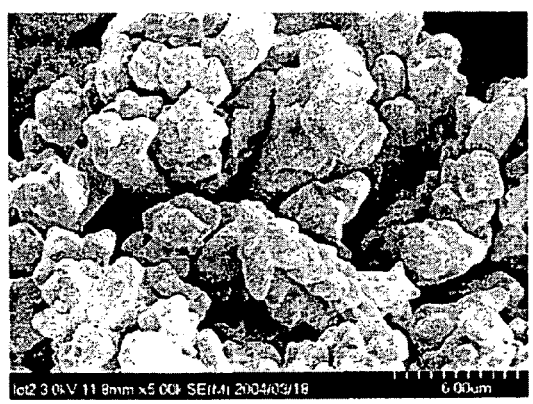
FIG. 4 is a set of scanning electron micrographs showing the starting copper powder and the specimen copper powder after crushing of Example 2.
Figure 4:

FIGS. 3/4
Example 1/2 (Before crushing) (After crushing)

Figure 5:
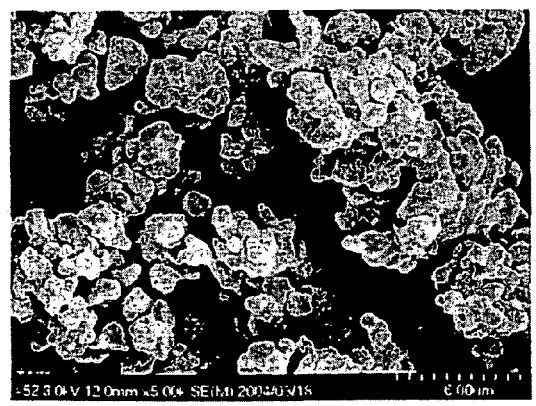
FIG. 5 is a set of scanning electron micrographs showing the starting copper powder and the specimen copper powder after crushing of Comparative Example 1.
Figure 5:
Figure 6:
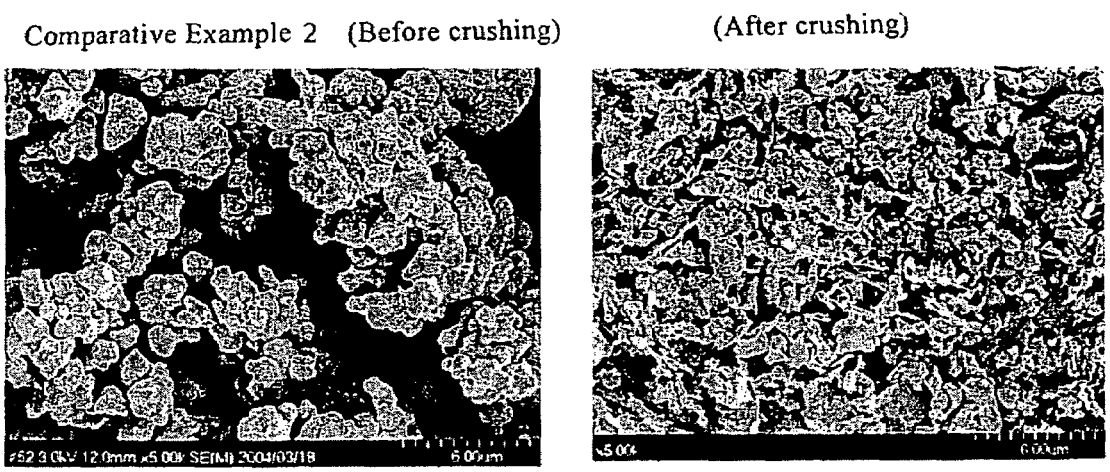
FIG. 6 is a set of scanning electron micrographs showing the starting copper powder and the specimen copper powder after crushing of Comparative Example 2.

FIG. 5/6
Comparative Example 1/2 (Before crushing) (After crushing)

FIG. 7
Example 1 (Jet mill crushing) Comparative Example 2 (Bead mill crushing)

What is claimed is;

1. A metal powder for a conductive paste comprising flaky particles whose average particle diameter D50 is not greater than 5 μm, whose flake aspect ratio of individual particles defined by a particle major axis/thickness is 3 to 30, a proportion of the particles having an aspect ratio of less than 3 or greater than 30 being less than 10%, and whose X value defined by equation (1) below is not greater than 0.5:

$$X \text{ value} = D50 \text{ (μm)/BET specific surface area (m}^2\text{/g)} \quad (1.$$

2. A metal powder for a conductive paste according to claim 1, wherein wart-like projections of a diameter not greater than 150 nm are present on the particle surfaces.

3. A metal powder for a conductive paste according to claim 1, wherein the metal powder is Cu powder.

4. A conductive paste using a metal powder set out in claim 1.

5. A metal powder for a conductive paste according to claim 2, wherein the metal powder is Cu powder.

6. A conductive paste using a metal powder set out in claim 2.

7. A conductive paste using a metal powder set out in claim 3.

* * * * *